United States Patent [19]
Yamaguchi

[11] Patent Number: 5,594,692
[45] Date of Patent: Jan. 14, 1997

[54] SEMICONDUCTOR INTEGRATED CIRCUIT

[75] Inventor: Atsuo Yamaguchi, Itami, Japan

[73] Assignee: Mitsubishi Denki Kabushiki Kaisha, Tokyo, Japan

[21] Appl. No.: 624,256

[22] Filed: Mar. 29, 1996

Related U.S. Application Data

[62] Division of Ser. No. 269,369, Jun. 30, 1994, Pat. No. 5,535,160.

[30] Foreign Application Priority Data

Jul. 5, 1993 [JP] Japan .................. 5-165672

[51] Int. Cl.$^6$ .................................................. G11C 7/00
[52] U.S. Cl. ............... 365/189.09; 365/210; 365/185.28; 365/185.29; 365/189.01
[58] Field of Search .................. 365/189.09, 189.01, 365/206, 218, 185.29, 185.28, 210; 327/381, 306, 103

[56] References Cited

U.S. PATENT DOCUMENTS

| | | | |
|---|---|---|---|
| 5,214,605 | 5/1993 | Lim et al. | 365/189.09 |
| 5,313,429 | 5/1994 | Chevallier et al. | 365/218 |

*Primary Examiner*—Tan T. Nguyen
*Attorney, Agent, or Firm*—Leydig, Voit & Mayer

[57] ABSTRACT

An integrated circuit has a built-in EEPROM which utilizes a high voltage to write or erase data. The integrated circuit operates with a lower power supply voltage. Switches supply a high voltage to bit lines, control gate lines, and word lines. Each switch includes a multi-stage charge pump comprising diode-connected transistors and capacitors. The switch has an enhanced charge capability and can transfer a high voltage from a low power supply voltage. Thus, the switch can operate successfully with a low power supply voltage.

2 Claims, 13 Drawing Sheets

5,594,692

SEMICONDUCTOR INTEGRATED CIRCUIT

This disclosure is a division of patent application Ser. No. 08/269,369, filed Jun. 30, 1994 now U.S. Pat. No. 5,535,160.

BACKGROUND OF THE INVENTION

1. Field of the Invention

The present invention relates to a semiconductor integrated circuit and, more specifically to a technique for expanding the operating voltage of a semiconductor integrated circuit such as a microcomputer having a built-in EEPROM.

1. Description of the Related Art

Referring to FIGS. 7–13, the configuration and operation of an EEPROM and its peripheral circuits will be described first taking a microcomputer having a built-in EEPROM as an example.

FIG. 7 is a block diagram illustrating a general configuration of a microcomputer having a built-in EEPROM (Electrically Erasable Programmable Read Only Memory) for use in an IC card. In FIG. 7, reference numeral 10 denotes an IC card or a microcomputer for performing data processing. In the microcomputer 10, reference numeral 1 denotes a CPU or a central processing unit that is responsible for operations and control of data processing. That is, the CPU 1 is responsible for execution and control of a program associated with the data processing. Reference numeral 4 denotes a ROM serving as a program memory for storing a program required for the data processing. That is, the ROM 4 stores a program that executes various functions a user of a card needs. Reference numeral 5 denotes an EEPROM acting as a nonvolatile memory in which personal information of a card user is written and stored. Reference numeral 6 denotes a RAM acting as a temporary memory for temporarily storing data required for the data processing. Reference numeral 7 denotes an input/output circuit for inputting and outputting data from or to peripheral devices. Reference numeral 2 denotes a system bus for making connection between the above-described component elements. Furthermore, P1 denotes a positive power supply terminal, P2 a negative power supply terminal or a ground terminal, P3 a reset input terminal for receiving a reset signal to initialize the CPU 1, P4 a clock input terminal for receiving a clock signal, and P5 an I/O terminal for inputting and outputting data. The I/O terminal P5 is connected to the input/output circuit 7 that is further connected to the system bus 2. The input/output circuit 7 is responsible for data communication via the I/O terminal P5 between the IC card 10 and peripheral devices (not shown).

FIG. 8 is a block diagram illustrating a general configuration of an EEPROM. In this figure, reference numeral 31 denotes a memory cell array comprising memory cells (refer to FIGS. 9 and 10) arranged in a matrix form, in which memory cells on each row are connected in common to a corresponding word line and memory cells on each column are connected in common to a corresponding bit line (refer to FIG. 10 for both word and bit lines). Reference numerals 2a and 2b denote data buses included in the system bus. Selection of word lines is accomplished by a row decoder 32, and selection of bit lines is accomplished by a column decoder 33. The row decoder 32 sets one word line to an H level and sets the other word lines to an L level according to a row address Ar obtained via an address latch 34. The column decoder 33 selectively turns on a Y-gate 35 according to a column address Ac obtained via the address latch 34 so as to electrically connect a bit line to a write buffer 36. The row decoder 32 and the column decoder 33 are enabled or disabled by a controller 37. The address latch 34 latches an address signal in response to the output from the controller 37, and provides a row address Ar and a column address Ac to the row decoder 32 and the column decoder, respectively.

The controller 37 sets a time width or a pulse duration of a specific signal by using a timer 38. The controller 37 is also responsible for control regarding activation and inactivation of an oscillator 45, a Vpp generator 44, a column latch 39, Vpp switches 40, 46, a sense amplifier 41, the row decoder 32, and the column decoder 33. The controller 37 latches data, that should be written, in the latch 43 according to a control clock signal Φ and a write signal WR, and further provides the data to the write buffer 36.

When enabled, the column latch 39 temporarily holds write data given on each bit line. The Vpp switches 40 and 46, when enabled, raise the potentials of a bit line and a control gate line (refer to FIG. 10) connected to the column latch 39, and a word line connected to the row decoder 32 to a high voltage of Vpp. The sense amplifier 41, when enabled, amplifies data that has been stored via the y-gate 35 in a memory cell of the memory cell array 31, and provides the amplified data to an output buffer 42. The output buffer 42, in response to the output from the controller 37, outputs the data that is read out by the sense amplifier 41 onto the data bus 2b as read-out data. The controller 37 controls the address latch 34 and the output buffer 42, according to the control clock signal Φ and the read-out signal RD.

FIGS. 9A and 9B illustrate one memory cell included in the memory cell array 31 of the EEPROM shown in FIG. 8, wherein FIG. 9A illustrates its cross-section and FIG. 9B illustrates an equivalent circuit of the cell shown in FIG. 9A. As can be seen from these figures, a memory cell comprises a memory transistor MQ and a selection transistor SQ. As shown in FIG. 9A, $n^+$-diffusion regions 21–23 are formed in a p-type semiconductor substrate 20 by diffusing n-type impurities selectively into the semiconductor substrate 20. Reference numeral 29 denotes an insulating layer. A gate 24 is formed above the area between the n+-diffusion regions 21 and 23 via an oxide film 47, and a floating gate 25 is formed above a part $n^+$-diffusion region 22 and above the area between the $n^+$-diffusion regions 22 and 23 via an oxide film 48. The floating gate 25 has, above the n+-diffusion region 22, a portion which is lower than the other portions. The portion of the oxide film 48 disposed under this lower portion of the floating gate 25 is as thin as 100 Å and acts as a tunnelling oxide film 48a. A control gate 26 corresponding to the floating gate 25 is formed above the floating gate 25 via an oxide film 49. A bit line 28 made of an aluminum interconnection layer is also formed above the $n^+$-diffusion region 21.

The memory cell having the above-described structure comprises a series connection of an enhancement-type selection transistor SQ and a memory transistor MQ having a variable threshold voltage, as shown in FIG. 9B. The selection transistor SQ has a gate 24, and utilizes $n^+$-diffision regions 21 and 22 as drain and source regions, respectively. The memory transistor MQ has a floating gate 25 and a control gate 26, and utilizes $n^+$-diffision regions 22 and 23 as drain and source regions, respectively.

Writing into the memory transistor MQ is done basically by applying a high voltage to either the drain 22 or the control gate 26, and grounding the other, so as to induce an electric field as high as 10 MV/cm in the tunnelling oxide film 48a, thereby injecting or emitting electrons into or from the floating gate 25. If electrons are injected into the floating gate 25 of the memory transistor MQ, then its threshold voltage shifts in the positive direction. If electrons are extracted from the floating gate 25, then the threshold voltage shifts in the negative direction. Nonvolatile writing is accomplished by using correspondence between positive and negative threshold voltages as information "1" and "0".

Information is basically read out from the memory transistor MQ as follows. An H-level signal is applied to the gate 24 of a selection transistor SQ of a selected memory cell, and the source 23 of the memory transistor MQ is made a ground potential. Furthermore, a read-out voltage VCG having a magnitude, for example of about 0 V is applied to the control gate 26. In this situation, if the threshold voltage of the memory transistor MQ is positive, then the memory transistor MQ turns off. If the threshold voltage is negative then the memory transistor MQ turns on. If the memory transistor MQ turns on, a current flows from the bit line 28 toward the ground level via the selection transistor SQ and via the memory transistor MQ. This current is converted into a voltage and detected by a sense amplifier 41 (refer to FIG. 8) connected to the bit line 28. Thus, information has been read out. An L-level signal is applied to gates of selection transistors SQ of all non-selected memory cells so that all these selection transistors SQ are turned off. Therefore, in this case, there is no current flowing from the bit line 28 to the ground level, even if memory transistors MQ have a negative threshold voltage.

FIG. 10 illustrates a peripheral circuit of the memory cell array 31 of the EEPROM shown in FIG. 8. For simplicity, only four memory cells MC1, MC2, MC3, and MC4 organized in 1-byte 1-bit fashion are shown in the figure. In the following description, signal lines and signals transmitted through these lines are denoted by the same notations. The memory cells MC1–MC4, as shown in FIG. 9, comprise memory transistors MQ1, MQ2, MQ3, MQ4 and selection transistors SQ1, SQ2, SQ3, SQ4, respectively. The drains of the selection transistors SQ1 and SQ2 are connected to a bit line BL1, and the drains of the selection transistors SQ3 and SQ4 are connected to a bit line BL2. The sources of the memory transistors MQ1 and MQ2 are connected to a source line SL1, and the sources of the memory transistors MQ3 and MQ4 are connected to a source line SL2.

These source lines SL1 and SL2 are grounded via transistors T51 and T52 whose gates are supplied with an inverted program cycle selection signal $\overline{\text{PRS}}$. The control gates of the memory transistors MQ1 and MQ2 are connected to a control gate line CGL1 via byte selection transistors T1 and T2, respectively. Similarly, the control gates of the memory transistors MQ3 and MQ4 are connected to a control gate line CGL2 via byte selection transistors T3 and T4, respectively. The gates of the transistors T1, T3, and the gates of the selection transistors SQ1, SQ3 are all connected to a word line WL1. The gates of the transistors T2, T4, and the gates of the selection transistors SQ2, SQ4 are all connected to a word line WL2. One end of the word line WL1 and that of WL2 are connected to the row decoder 32 via high voltage isolation transistors T5 and T6, respectively, wherein a power supply voltage Vcc is applied to the gates of the high voltage isolation transistors T5 and T6.

One end of each of the bit lines BL1, BL2 and one end of each of the control gate lines CGL1, CGL2 are connected to column latches 39a, 39b, 39c, 39d, respectively, via transistors T7, T8, T9, and T10, respectively. The other ends of the control gate lines CGL1 and CGL2 are connected to a common control gate line CCGL via transistors T61 and T62, respectively. The other ends of the bit lines BL1 and BL2 are connected to an input/output line I/O via Y-gate transistors T71 and T72, respectively. The gates of the transistors T61 and T77 are connected to an output line CDL1 of the column decoder 33. Similarly, the gates of the transistors T62 and T72 are connected to an output line CDL2. The common control gate line CCGL is connected to a buffer BF1, and the input/output line I/O is connected to a write buffer 36 and to the sense amplifier 41. The control gate lines CGL1, CGL2, the bit lines BL1, BL2, and the word lines WL1, WL2 are connected to Vpp switches 40a–40d, 46e, 46f, respectively. The Vpp switches 40a–40d, 46e, 46f are connected to a high voltage line VPPL via which a high voltage of 15–20 V is supplied. In response to an applied erase clock signal CLKE, program clock signal CLKP, and word line clock signal CLKW, the Vpp switches 40a–40d, 46e, 46f raise the connected control gate lines CGL1, CGL2, bit lines BL1, BL2, and word lines WL1, WL2 up to the high voltage Vpp if these lines are at an H level. When the word lines WL1 and WL2 are raised to the high voltage Vpp, the row decoder 32 is isolated from the high voltage Vpp by the transistors T5 and T6 whose gates are supplied with the supply voltage Vcc.

A bit signal transfer control signal BTTR is connected to the gates of the transistors T7 and T8, and a control gate signal transfer control signal CGTR is connected to the gates of the transistors T9 and T10. When these signals are at H levels, mutual signal communications are accomplished between the bit lines BL1, BL2, control gate lines CGL1, CGL2, and the column latches 39a, 39b, 39c, 39d. When the bit lines BL1, BL2, and the control gate lines CGL1, CGL2 are raised to the high voltage Vpp, the column latches 39a, 39b, 39c, 39d are isolated from the high voltage Vpp, since the gates of the transistors T7–T10 are at the Vcc level.

The transistors T11 and T12 are connected to the control gate lines CGL1 and CGL2, respectively, and the gates of the transistors T11 and T12 are connected to a control gate line reset signal CGRST. When the control gate line reset signal CGRST rises to an H level, the control gate lines CGL1 and CGL2 falls to an L level. The bit lines BL1 and BL2 are connected to transistor T13 and T14, respectively, and the gates of the transistors T13 and T14 are connected to a bit line reset signal BTRST. When the bit line reset signal BTRST rises to an H level, the bit lines BL1 and BL2 fall to an L level. The bit lines BL1 and BL2 are also connected to transistors T15 and T17, respectively. The transistors T15 and T17 are connected to transistors T16 and T18 respectively. The gates of the transistors T15 and T17 are connected to the column latches 39a and 39b, respectively. The gates of the transistors T16 and T18 are connected to a precharge signal PRCH. When the column latches 39a and 39b are at an H level, if the precharge signal PRCH rises up to an H level, then both bit lines BL1 and BL2 rise to an H level.

The inverted program cycle selection signal $\overline{\text{PRS}}$, the control gate line reset signal CGRST, the bit line reset signal BTRST, the control gate signal transfer control signal CGTR, the bit signal transfer control signal BTTR, and the precharge signal PRCH are driven by buffers BF2, BF3, BF4, BF5, BF6, and BF7, respectively.

Referring to FIGS. 8 and 10, read-out operation of the EEPROM will be described below. First, selections of word lines WL, control gate lines CGL, and bit lines BL are performed by the row decoder 32 and the column decoder 33. In the following description, an operation will be explained for the case where a memory cell MC1 is selected by selecting the word line WL1 and by turning on the transistors T61 and T71 so as to select the control gate line CGL1 and the bit line BL1. The inverted program cycle selection signal $\overline{PRS}$ is raised to an H level, and the source lines SL1 and SL2 are grounded. Furthermore, the controller 37 disables the column latches 39a–39d, the Vpp switches 40a–40d, 46e, 46f, and the write buffer 36. The buffer BF1 supplies a voltage of 0 V to the gate of the memory transistor MQ1 via the common control gate line CCGL, transistor T61, and transistor T1. Then, if the memory transistor MQ1 has a positive threshold voltage the memory transistor MQ1 turns off. If the threshold voltage is negative, the transistor MQ1 turns on. The presence or absence of a current flowing through the bit line BL7 due to the turning on or off of the memory transistor MQ1 is detected from the change in the potential on the input/output line I/O by the sense amplifier 41. The potential change detected by the sense amplifier 41 is further amplified, and provided as a read-out output signal. In this way, the read-out operation is performed.

FIG. 11 is a timing chart illustrating various signal waveforms relating to a writing operation of the EEPROM. Referring to FIGS. 8–11, a writing operation will be explained below for the case where the memory cell MC1 is selected. First, a latch cycle starts with a latch starting signal WE to drive a latch signal LATCH to an H level. When the latch cycle starts, the controller 37 enables the column latches 39a–39d, the column decoder 33, and the write buffer 36, and the common control gate line CCGL is set to an H level. On the other hand, the controller 37 disables the row decoder 32 and the sense amplifier 41. In a time period during which the latch signal LATCH is kept at the H level, the transistors T61 and T71, selected by the column decoder 33, turn on, and the data ("H" corresponds to information "0" and "L" corresponds to information "1") held by the data latch 43 is latched by the column latch 39a via the write buffer 36, the input/output line I/O, the bit line BL1, and the transistor T7. Furthermore, an H level is latched by the column latch 39c via the common control gate line CCGL and the control gate line CGL1. Then, once a write starting signal goes to an H level, the signal LATCH changes to an L level, and an erase cycle signal ERS rises, whereby an erase cycle starts. An erasing cycle is such a cycle during which the erasing cycle signal ERS is at an H level, and, a program cycle is such a cycle during which the program cycle selection signal PRS (that is an inverted signal of the inverted program cycle selection signal $\overline{PRS}$) is at an H level. The H-level pulse durations of these signals ERS and PRS are set to proper values by the controller 37 by using the timer 38.

During the erasing cycle, the row decoder 32 is enabled by the controller 37, and only the word line WL1 is set to an H level by the row decoder 32. Furthermore, the column decoder 33 is disabled by the controller 37. A high voltage Vpp having a pulse duration of about 4 msec is then applied on the high voltage line VPPL thereby applying the high voltage Vpp to the Vpp switches 40a–40d, 463, 46f. Then, the controller 37 makes a high frequency oscillator, which comprises an oscillating circuit 45 and a Vpp generator 44, generate a high frequency erase clock signal CLKE and a word line clock signal CLKW having a frequency of a few MHz, which are supplied to the Vpp switches 40a, 40b, and the Vpp switches 46e, 46f, respectively. Since the inverted program cycle selection signal $\overline{PRS}$ is at the H level, the source lines SL1 and SL2 are grounded. In the above-described state, the word line WL1 and the control gate line CGL1 are raised to the high voltage Vpp by the Vpp switches 40a and 46e, respectively. As a result, tunneling occurs between the floating gate 25 (refer to FIG. 9) and the drain region ($n^+$-diffusion region 22) of the memory transistor MQ1, whereby electrons are injected into the floating gate 25. As a result, the threshold voltage of the memory transistor MQ1 shifts in the positive direction (information "1" is stored). When the erasing cycle is complete, the potential of the control gate line CGL1 is reset to an L level.

The erasing cycle signal ERS then falls, and the precharge signal PRCH rises to an H level. Then, a program cycle starts with rising of the program cycle selection signal PRS. The controller 37 disables the word line clock signal CLKW and the erase clock signal CLKE. Subsequently, the controller 37 provides again a high frequency program clock signal CLKP and a word line clock signal CLKW having a frequency of a few MHz from the high frequency oscillator to the Vpp switches 40c, 40d, and the Vpp switches 46e, 46f, respectively. Since the inverted signal $\overline{PRS}$ is at an L level, the source line SL1 is in a floating state. In this situation, if an H level is latched by the column latch 39a, the word line WL1 and the bit line BL1 are raised to the high voltage Vpp. As a result, tunneling occurs between the floating gate 25 (refer to FIG. 9) and the drain region ($n^+$-diffusion region 22) of the memory transistor MQ1, whereby electrons are emitted from the floating gate 25. As a result, the threshold voltage of the memory transistor MQ1 shifts in the negative direction (information "0" is stored). On the other hand, in the case where an L level is latched by the column latch 39a, only word line WL1 rises up to the high voltage Vpp, and the threshold voltage of the memory transistor MQ1 is maintained unchanged. In this way, the writing operation is complete.

FIG. 12 is a circuit diagram illustrating the internal configuration of the Vpp generator (high voltage generator) 44 shown in FIG. 8, which will be described below.

The gate and the drain of a transistor M1 are is connected to each other. A capacitor C1 is connected to the node at which the gate and the drain are connected. The source of the transistor M1 is connected to the drain of a transistor M2 disposed at the following stage. The gate and the drain of the transistor M2 are also connected to each other, and a capacitor C2 is also connected to the node which connects the gate and drain of the transistor M2. Clock signals CLK2 and CLK1 are applied to the other ends of the capacitors C1 and C2 connected to the drains of the transistors M1 and M2, respectively, wherein the phases of the clock signals CLK2 and CLK1 are opposite each other. Several stages, each having a configuration similar to that described above, are cascaded. The drain of the transistor M1 at the first stage is connected to the source of the transistor M4. The drain of the transistor M4 is connected to the power supply voltage Vcc. The gate of the transistor M4 is controlled by the output signal provided by the controller 37. The charge pump output is provided via the source of the transistor M3 at the end stage. The high voltage Vpp is provided as the output of the Vpp generator 44, and applied to the Vpp switches 40a–40d, 46e, 46f via the high voltage line VPPL so as to raise the control gate lines CGL1, CGL2, the bit lines BL1, BL2, and the word lines WL1, WL2 up to the high voltage according to control signals. The transistor M7 discharges the high voltage Vpp in response to the signal provided by the controller 37.

The Vpp generator 44 also includes a waveform shaping circuit 200, which will be described later.

Now, the configuration of a high voltage switch shown in FIG. 10 will be described taking the high voltage switch 40c as an example. The other high voltage switches are configured in the same manner as that of the high voltage switch 40c, and thus these will not be described. The drain of a transistor M5 is connected to the high voltage, and its source is connected to the drain of a diode-connected transistor M6. The source of the transistor M5 is further connected to one end of a capacitor C4. The term "diode connection" refers to a configuration in which the gate and the drain of a transistor are connected to each other, forming a diode between the source and the drain. The source of the transistor M6 is connected to the gate of the transistor M5, and further connected to the bit line BL1. The other end of the capacitor C4 is connected to the program clock signal CLKP. Clock signals having the same phase are applied to the clock signal lines CLKP and CLK2. A clock signal having a phase opposite to those applied to CLKP and CLK2 is applied to the clock signal line CLK1 (refer to FIG. 12).

Operations of the Vpp generator 44 and of the high voltage switch 40c will be described below. In the Vpp generator 44 shown in FIG. 12, charges are stored in the capacitor C1 when the clock signal CLK2 is at an L level. When the clock signal CLK2 rises, the charges stored in the capacitor C1 are transferred to the capacitor C2 via the transistor M1. When the clock signal CLK2 then falls with the rising clock signal CLK1, charges are further stored in the capacitor C1. At this time, charges stored in the capacitor C2 are transferred to a capacitor of the following stage. In this operation step, no charges are transferred to the capacitor C1 since the transistor M2 acts as a diode. In this way, charges are sequentially transferred according to the clock signals CLK1 and CLK2, and finally, a raised voltage is output via the charge pump output.

In the high voltage switch 40c shown in FIG. 10, when the column latch 39a holds an H level and the signal BTTR is at an H level, the bit line BL1 rises. In this state, when the signal CLKP is at an L level, the transistor M5 turns on, whereby the capacitor C4 is charged by the high voltage Vpp until the transistor M5 turns off. As a result, the signal CLKP rises, whereby the charges stored in the capacitor C4 are transferred to the bit line BL1 via the transistor M6. As a result, the potential at the gate of the transistor M5 connected to the bit line BL1 rises, and thus the capacitor C4 is further charged by the high voltage until the transistor M5 turns off (the signal CLKP is at an L level, in this state). In this way, the operation is performed repeatedly, whereby the bit line BL1 can be raised to the high voltage Vpp according to the signal applied via the column latch 39a.

The other Vpp switches operate in the same manner as in the case of the high voltage switch 40c described above.

The clock signals CLK1, CLK2, CLKW, CLKE, and CLKP are generated based on the signal from the oscillator 45, the erase cycle signal ERS, and the program cycle selection signal PRS.

As described above, a high voltage is applied to the control gate or the drain of a memory transistor MQ via a selection transistor SQ. However, if the output of the high voltage (Vpp) switch is directly applied to the control gate 26 or the drain 22 of a memory transistor MQ, the small time constant associated with the rising waveform of the output of the high voltage Vpp, that is, the rapid rising of the high voltage Vpp causes great damage to the tunneling oxide film 48a. In the worst case, the tunnelling oxide 48a will break down. To avoid the above problem, there is provided a waveform shaping circuit in the Vpp generator 44, for properly setting the rising time constant to a rather large value thereby reducing the damage to the tunnelling oxide film 48a.

FIG. 12 also includes the waveform shaping circuit 200.

As shown in this figure, the output voltage Vpp of the Vpp generator 44 is divided by the capacitors C11 and C12, and the divided voltage is applied as a sample signal to the negative input of a comparator 220 via an interconnecting line L1. On the other hand, the positive input of the comparator 220 is connected to the output of the power supply voltage Vcc via a switched capacitor 210 and an interconnecting line L2.

The switched capacitor 210 comprises: transistors T211 and T212 connected in series between the power supply voltage Vcc and the interconnecting line L2; a capacitor C14 with one end connected to the node connecting the transistors T211 and T212 and the other end grounded; and a capacitor C13 connected between the interconnecting line L2 and ground. A clock signal Φ and an inverted clock signal $\overline{\Phi}$ are applied to the gates of the transistors T211 and T212, respectively. The drain of the transistor T211 is connected to the power supply voltage Vcc. The source of the transistor T212 is connected to the interconnecting line L2.

With this arrangement, waveform shaping is performed on the rising voltage on the interconnecting line L4 according to a time constant determined by the clock signal Φ of the switched capacitor 210 and the capacitors C13 and 14. The waveform-shaped voltage is applied as a reference voltage to the positive input of the comparator 220.

The difference between this reference voltage and the output voltage of the above-described Vpp generator 44 is output as a feedback signal SF by the comparator 220. According to this feedback signal SF, the clock signals CLK1 and CLK2 are controlled so that the high voltage output of the Vpp generator 44 may rise up at a rate similar to that of the reference voltage.

FIG. 13 illustrates a configuration of a semiconductor substrate of a semiconductor integrated circuit for a microcomputer having a built-in EEPROM, according to a conventional technique. FIG. 13A schematically illustrates a layout of functional blocks on a semiconductor substrate, and FIG. 13B is a cross-sectional view of the semiconductor substrate of FIG. 13A taken along line 13B—13B. In this figure, reference numeral 100 denotes a p-type semiconductor substrate on which a semiconductor integrated circuit is formed. Reference numerals 101, 102, 103 denote a CPU, an ROM/RAM, and a UART or an input/output portion, respectively. Reference numerals 104 and 105 denote an EEPROM control system. Reference numerals 107 and 108 denote an EEPROM memory cell array, and an EEPROM peripheral high voltage system, respectively. Reference numerals 110, 111, 112 denote an n-well region, a p-type substrate region, a p-well region, respectively. Reference numeral 114 denotes a twin well region consisting of the n-well region 110 and the p-well region 112.

The EEPROM memory cell array 107 corresponds to the memory cell array 31 in FIG. 8, and to four portions each surrounded by a broken line in FIG. 10 wherein each portion comprises one memory cell MC and a transistor T. The EEPROM peripheral high voltage system 108 corresponds to elements of FIG. 8 including the Vpp switches 40, 46, the Y-gate 35, and a portion (a high voltage portion) of the Vpp generator 44. The EEPROM peripheral high voltage system 108 also corresponds to elements of FIG. 10 including the Vpp switches 40a–40d, the Vpp switches 46e, 46f, the transistors T5–T18, the transistors T51, T52, and the transistors T61, T62, T71, T72. The EEPROM peripheral high voltage system 108 also corresponds to elements of the Vpp generator 44 shown in FIG. 12, including the transistors M1–M4, M7, and the capacitors C1–C3, C11, C12. These corresponding portions of FIG. 10 and 12 are each surrounded by an alternating long and short dash line 111a.

The EEPROM control. systems 104 and 105 correspond to elements of FIG. 8 including the write buffer 36, the sense amplifier 41, the output buffer 42, the data latch 43, the column decoder 33, the row decoder 32, the address latch 34, the column latch 39, the controller 37, the timer 38, the oscillator 45, and the other portion of the Vpp generator 44. The EEPROM control systems 104 and 105 also correspond to elements of FIG. 10 including the write buffer 36, the sense amplifier 41, the buffers BF1–BF7, the column decoder 33, the row decoder 32, and the column latch 39a–39d. The EEPROM control systems 104 and 105 also correspond to the portion of the waveform shaping circuit 200 of FIG. 12 except for the capacitors, C1 and C12.

Portions, which are not subjected to the application of the high voltage Vpp, in the CPU 101 the ROM/RAM 102, the UART 103, and the EEPROM control systems 104, 105 are formed with CMOS structures in twin well regions 114 each consisting of an n-well region 110 and a p-well region 112, as shown in FIG. 13A or 13B. On the other hand, elements to which the high voltage Vpp is applied such as the EEPROM memory cell array 107 and the EEPROM peripheral high voltage system 108, are formed with NMOS structures on the p-type substrate region 111. It is desirable that the p-type substrate region 111, in which the EEPROM memory cell array 107 and the EEPROM peripheral high voltage system 108 are formed, be surrounded by a p-well region as shown by the broken line 112a in FIG. 13A.

As described above, the region to which the high voltage Vpp is not applied is formed on the twin well region 114 consisting of the p-well region. 112 and the n-well region 110 each formed in the p-type semiconductor substrate so that a high integration density may be obtained by the most advanced technology. Regions to which the high voltage Vpp is applied are formed, for example, with-NMOS structures on the p-type substrate region 111 so that the substrate effects may be suppressed whereby the high. voltage system may operate successfully. Furthermore, the p-type substrate region 111 is surrounded by the p-well region so as to enhance the resistance to latchup so that latchup effects may be suppressed.

In the above description, a conventional technique of a semiconductor integrated circuit for a microcomputer having a built-in EEPROM has been discussed. However, for example in the Vpp switch 40c shown in FIG. 10, when the high voltage Vpp is selectively supplied to a memory cell, it is required that the amplitude of the clock signal should be greater than the sum of the threshold voltage Vth of the transistor M5 which is responsible for the selection of the memory cell and the threshold voltage Vth of the transistor M6 forming the charge pump. If this condition is not met, the high voltage Vpp does not appear at the output. Since the amplitude of the clock signal is determined by the power supply voltage Vcc, if the power supply voltage Vcc decreases, it becomes impossible to transfer the high voltage Vpp to the output. The threshold voltage Vth increases as the source voltage increases. Therefore, it will become more difficult to transfer the high voltage to the output as the output increases. For these reasons, the Vpp switch (high voltage switch) causes difficulty in reduction of the operating voltage of a semiconductor integrated circuit.

In the Vpp generator, the charge pump output of the Vpp generator is applied to the input of the waveform shaping circuit. However, there is a slight difference in voltage waveform between the charge pump output and the actual output of the Vpp switch. In this sense, the waveform shaping is not accurate. Especially when the Vpp switch has a high capability, the difference in voltage between the charge pump output and the actual output of the Vpp switch becomes great.

SUMMARY OF THE INVENTION

An object of the present invention is to solve the above problems. More specifically, it is an object of the present invention to provide a semiconductor integrated circuit or the like having a Vpp switch which can operate with a low power supply voltage to output a high voltage Vpp.

The above objects are achieved by the following aspects of the present invention. According to a first aspect of the present invention, there is provided a semiconductor integrated circuit comprising: an EEPROM memory cell array comprising a plurality of memory cells disposed in a matrix, each memory cell including a non-volatile memory transistor capable of electrically writing and erasing data; means for generating a high voltage required to write data into or erase data from the memory cell array; means for selectively supplying the high voltage to a memory cell; and means for controlling the above-described means so as to control operations of writing, reading, and erasing the memory cell array. The means for selectively supplying the high voltage to a memory cell includes a selection transistor, a plurality of charge pump transistors, the drain and the gate of each charge pump transistor being connected to each other, and a plurality of capacitors, wherein the plurality of charge pump transistors and the plurality of capacitors form a multi-stage charge pump.

According to a second aspect of the present invention, there is provided a semiconductor integrated circuit comprising: an EEPROM memory cell array comprising a plurality of memory cells disposed in a matrix, each memory cell including a non-volatile memory transistor capable of electrically writing and erasing data; means for generating a high voltage required to write data into or erase data from the memory cell array; means for selectively supplying the high voltage to a memory cell; and means for controlling the above-described means so as to control operations of writing, reading, and erasing data. The means for selectively supplying the high voltage to a memory cell includes a selection transistor, a charge pump transistor, the drain and the gate of the charge pump transistor being connected to each other; and a capacitor, the charge pump transistor and the capacitor forming a charge pump, threshold voltages of the selection transistor and the charge pump transistor being set to different values such that the threshold voltage of the charge pump transistor is lower than the threshold voltage of the selection transistor.

According to a third aspect of the present invention, there is provided a semiconductor integrated circuit comprising: an EEPROM memory cell array comprising a plurality of memory cells disposed in a matrix, each memory cell including a non-volatile memory transistor capable of electrically writing and erasing data; means for generating a high voltage required to write data into or erase data the memory cell array; means for selectively supplying the high voltage to a memory cell; and means for controlling the above-described means so as to control operations of writing, reading, and erasing data. The means for selectively supplying the high voltage to a memory includes a selection transistor for performing selection, a plurality of charge pump transistors, the drain and the gate of each charge pump transistor being connected to each other, and a plurality of capacitors, the plurality of charge pump transistors and the plurality of capacitors forming a multi-stage charge pump, threshold voltages of the selection transistors and the charge pump transistors being set to different values such that the threshold voltages of the charge pump transistors are lower than the threshold voltages of the selection transistors.

According to a fourth aspect of the present invention, there is provided a semiconductor integrated circuit comprising: an EEPROM memory cell array comprising a plurality of memory cells disposed in a matrix, each memory cell including a non-volatile memory transistor capable of electrically writing and erasing data; means for generating a high voltage required to write data into or erase data from the memory cell array; means for selectively supplying the high voltage to a memory cell; means for shaping a waveform of the high voltage so that the high voltage is prevented from rising too quickly; and means for controlling the above-described means so as to control operations of writing, reading, and erasing data. The means for shaping the waveform receiving a high voltage which has passed through the means for selectively supplying the high voltage, the means for shaping the waveform performing the waveform-shaping based on the received high voltage.

According to a fifth aspect of the present invention, there is provided a semiconductor integrated circuit according to the fourth aspect, wherein the means for shaping a waveform includes a dummy circuit of the means for selectively supply the high voltage, the dummy circuit being used only to supply a high voltage to the input of the means for shaping a waveform.

According to a sixth aspect of the present invention, there is provided a semiconductor integrated circuit according to the fourth aspect, wherein the semiconductor integrated circuit further comprises high voltage detection means for detecting the largest of the high voltages which have passed through the means for selectively supplying a high voltage, the high voltage detection means supplying the detected largest high voltage to the input of the means for shaping a waveform.

In the Vpp switch, which acts as means for selectively supplying a high voltage to a memory cell, according to the first aspect of the present invention, there is provided a multi-stage charge pump wherein each stage comprises a capacitor and a transistor whose drain and gate are connected to each other (in a form of diode-connection) so that the charging capability is enhanced, whereby the Vpp switch can operate with a lower power supply voltage Vcc.

In the Vpp switch, which acts as means for selectively supplying a high voltage to a memory cell, according to the second aspect of the present invention, the threshold voltage Vth of a diode-connected charge pump transistor is set to a value lower than the threshold voltage Vth of an on/off selection transistor (in a multi-Vth fashion), such that the threshold voltage of the diode-connected transistor is set to a low value while maintaining the operation capability of the selection transistor, thereby enhancing the charging capability, whereby the Vpp switch can operate with a low power supply voltage Vcc.

In the third aspect of the present invention, the first and second aspects of the present invention are combined such that a Vpp switch, which acts as means for selectively supplying a high voltage to a memory cell, comprises a multi-stage charge pump, and furthermore the threshold voltage Vth of a diode-connected charge pump transistor is set to a value lower than the threshold voltage Vth of an on/off selection transistor, thereby further enhancing the charging-up capability, whereby the Vpp switch can operate with a lower power supply voltage Vcc.

In the fourth through sixth aspects of the present invention, a slight difference between the voltage generated by a charge pump of high voltage generation means and the output voltage of a Vpp switch, especially a rather large difference occurring when the charging capability of the Vpp switch is enhanced, is suppressed by employing the output of the Vpp switch as a monitoring point of waveform shaping means for preventing the high voltage from rising too quickly, whereby more accurate waveform shaping can be achieved. Especially in the fifth aspect of the present invention, a high voltage generation means includes a dummy Vpp switch which is used only to provide feedback of the high voltage. Furthermore, in the sixth aspect of the present invention, there is provided high voltage detection means for detecting the greatest high voltage among all lines having a Vpp switch in a memory cell array, wherein the detected greatest high voltage is fed back to the input of the waveform shaping means so that waveform shaping based on the fed-back signal, thereby ensuring that the high voltage may be prevented from rising too quickly.

DESCRIPTION OF THE PREFERRED EMBODIMENTS

EMBODIMENT 1

Figure 1:
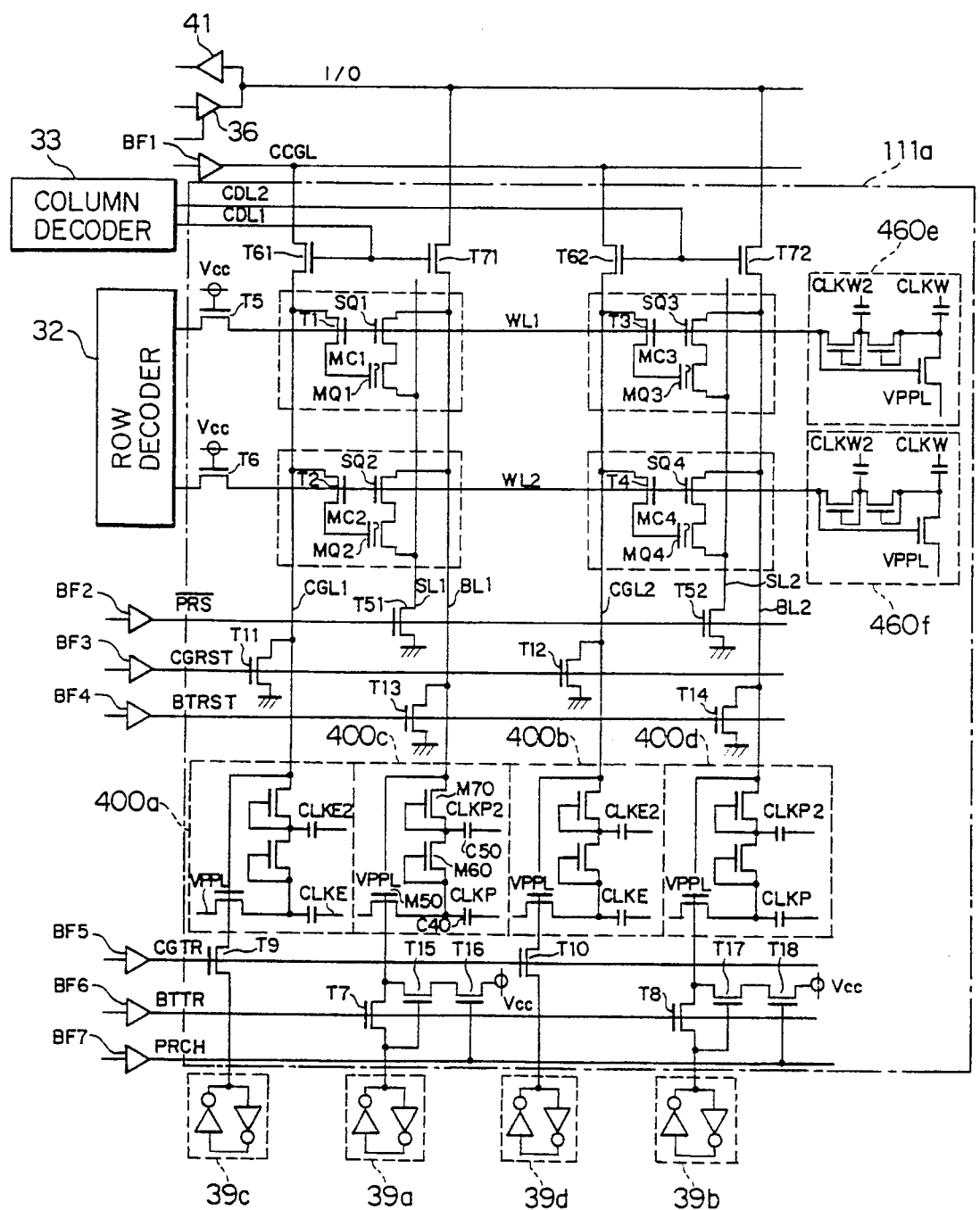
FIG. 1 is a circuit diagram illustrating the configuration of a peripheral portion of an EEPROM memory cell array in a semiconductor integrated circuit according to a first embodiment of the present invention.
Figure 7:
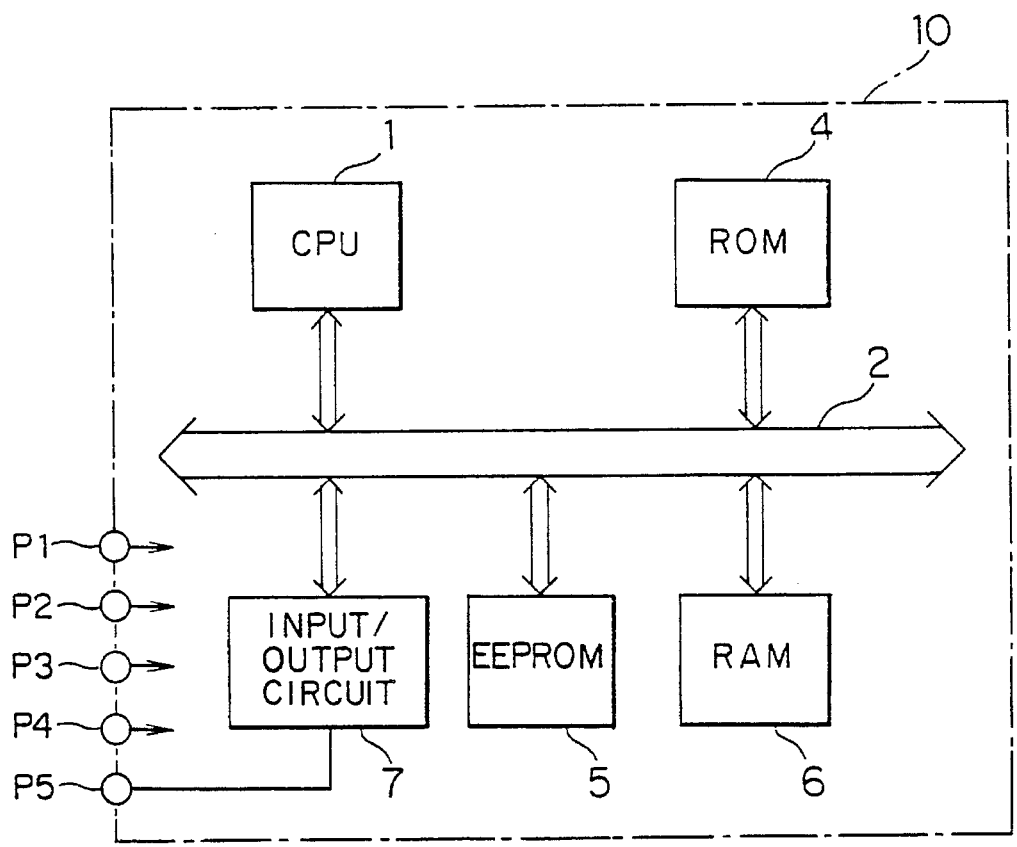
FIG. 7 is a block diagram illustrating a general configuration of a conventional microcomputer having a built-in EEPROM for use in an IC card.

FIG. 1 is a circuit diagram illustrating a circuit configuration of a peripheral portion of an EEPROM memory cell array in a semiconductor integrated circuit according to the first aspect of the present invention. Basically, the general configuration of the EEPROM of the semiconductor integrated circuit according to the present invention is the same as that of the EEPROM according to the conventional technique shown in FIG. 8. The general configuration of the semiconductor integrated circuit according to the present invention is also basically the same as that of the integrated circuit according to the conventional circuit shown in FIG. 7 or 13.

Figure 10:
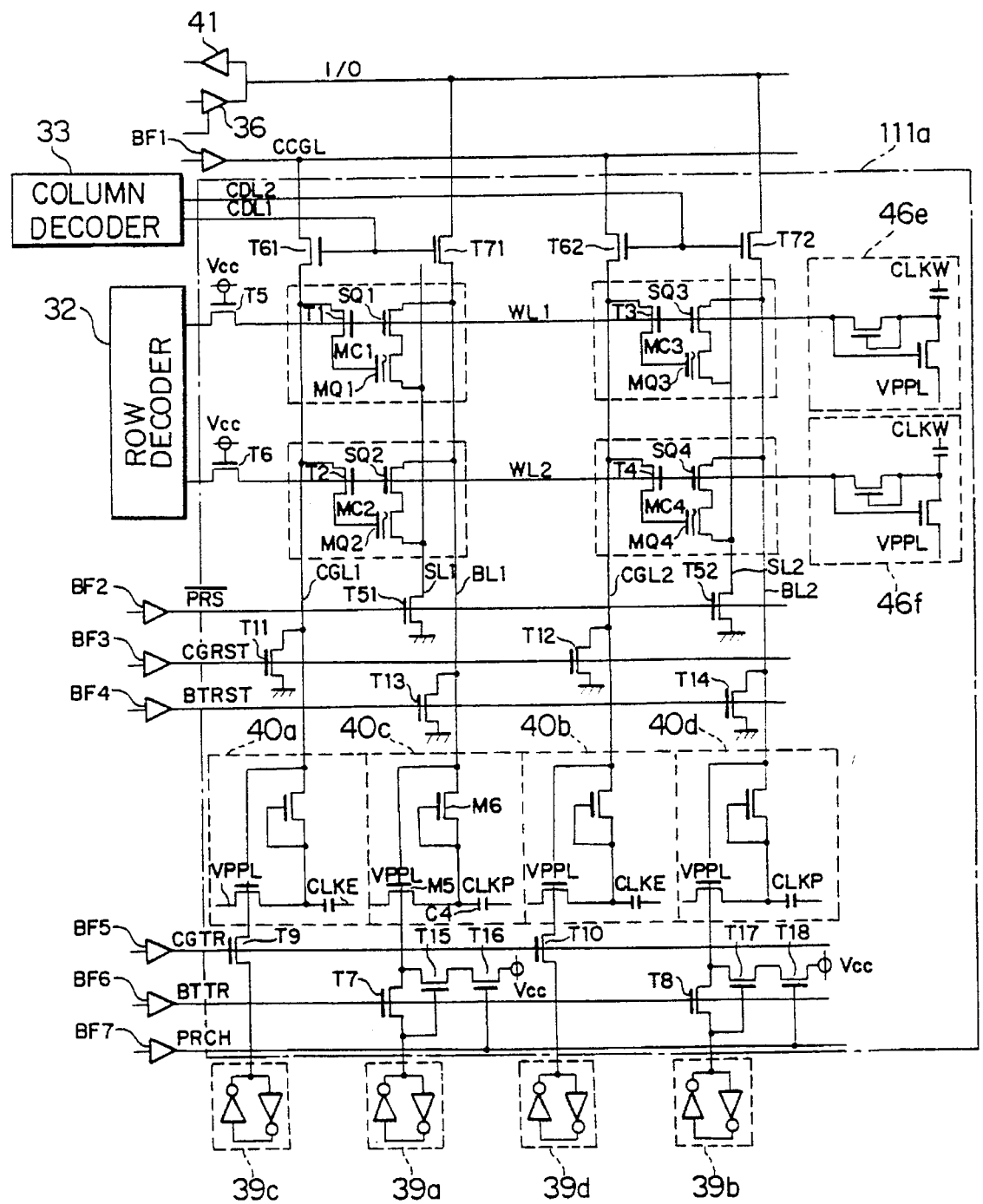
FIG. 10 is a circuit diagram illustrating the configuration of a peripheral portion of the EEPROM memory cell array of FIG. 8.
Figure 11:
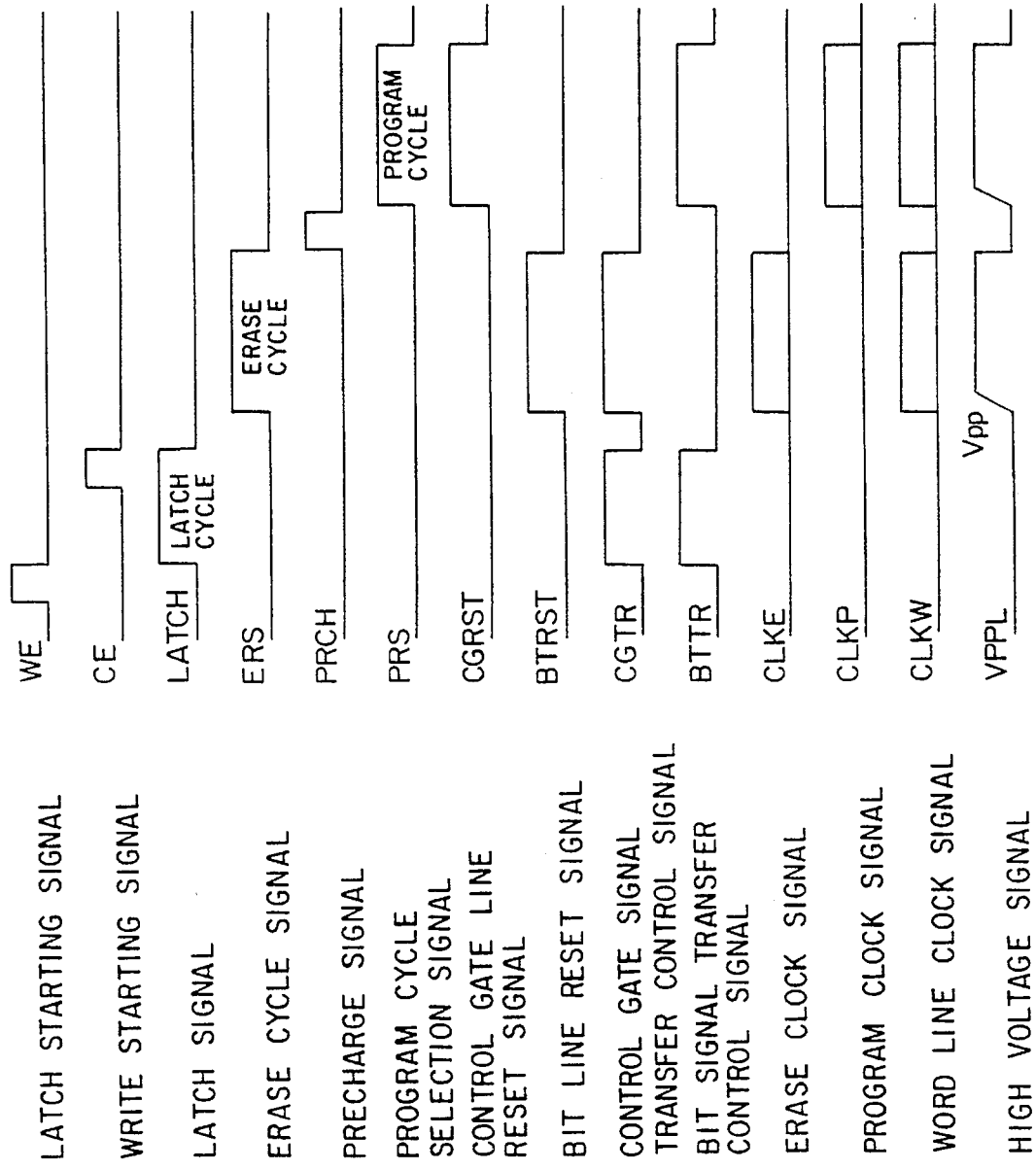
FIG. 11 is a timing chart illustrating various signals relating to writing operation of an EEPROM.
Figure 13A:
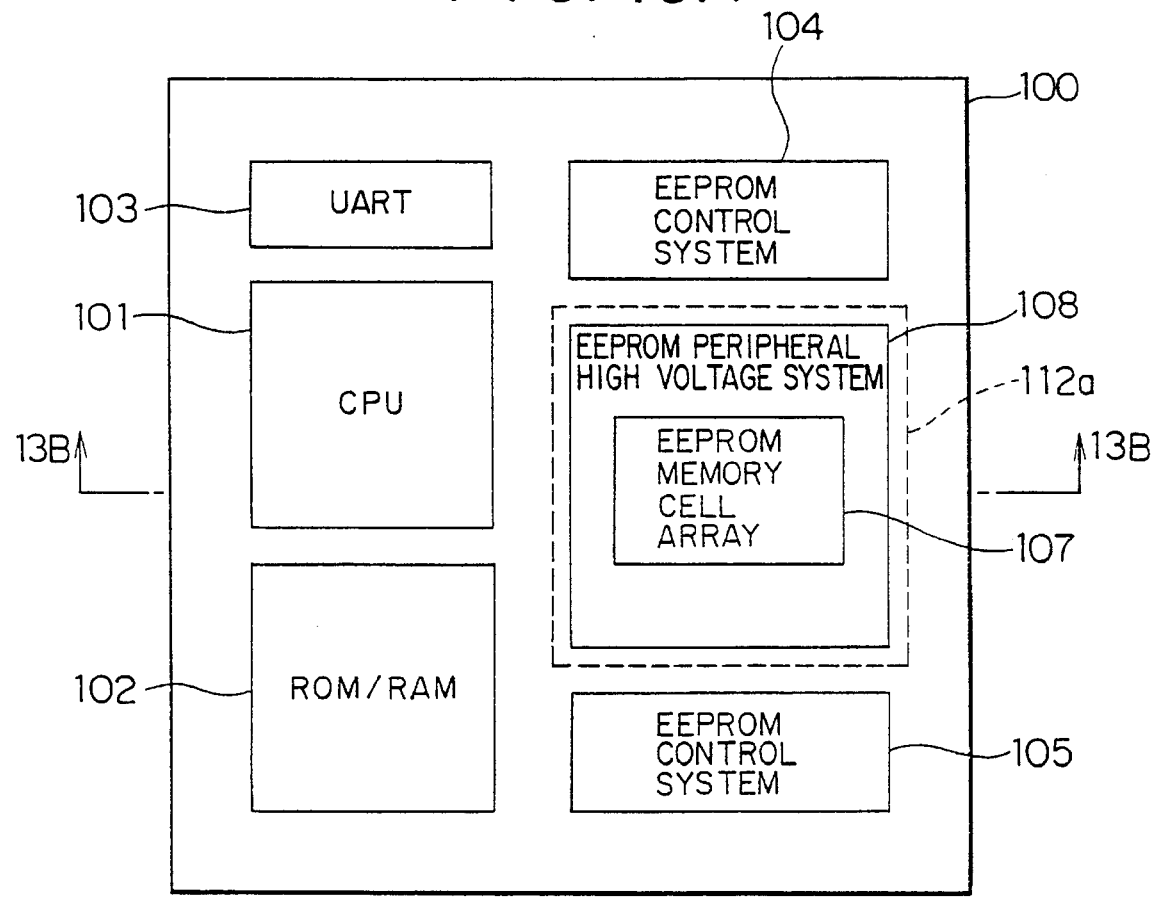
FIG. 13A is a schematic diagram illustrating a layout of functional blocks on a semiconductor substrate of a semiconductor integrated circuit for use in a microcomputer having a built-in EEPROM.
Figure 13B:
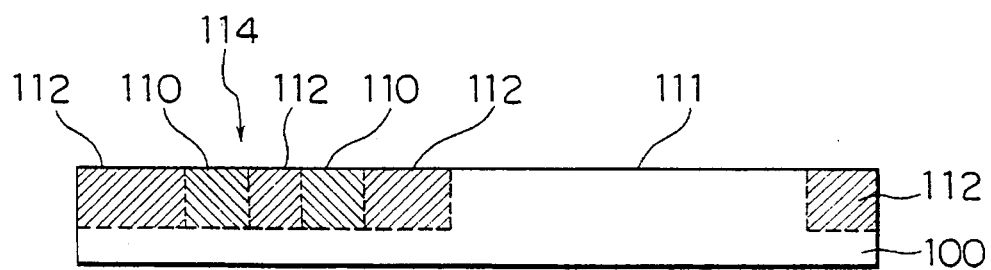
FIG. 13B is a cross-sectional view of the semiconductor substrate of FIG. 13A taken along line 13B—13B.

In FIG. 13, there are shown Vpp switches 400a–400d, 460e, and 460f which correspond to the conventional Vpp switches 40a–40d, 46e, and 46f, respectively, shown in FIG. 10. The other portion is basically the same as that according to the conventional technique. Since the Vpp switches 400a–400d, 460e, and 460f have the same configuration, the following description will deal with only the Vpp switch 400c.

There is provided a selection transistor M50 responsible for selection in the operation of selectively supplying a high voltage to a memory cell. There are also provided charge pump transistors M60, M70, and capacitors C40, C50, which form a charge pump consisting of a plurality of stages (two stages, for example). The transistor M60 is diode-connected, and its source is connected to the transistor M70 whose gate and source are directly connected to each other. The source of the transistor M70 is connected to the bit line BL1. A clock signal CLKP2 is applied via the capacitor C50 to the node which connects the transistors M60 and M70, wherein the clock signal CLK2 has an opposite phase to that of a clock signal CLKP applied to the capacitor C40. The gate of the transistor M50 is connected to the bit line BL1. That is, the Vpp switch of the present embodiment includes a charge pump consisting of a plurality of stages so that enhanced charge pump performance may be obtained.

Figure 2:
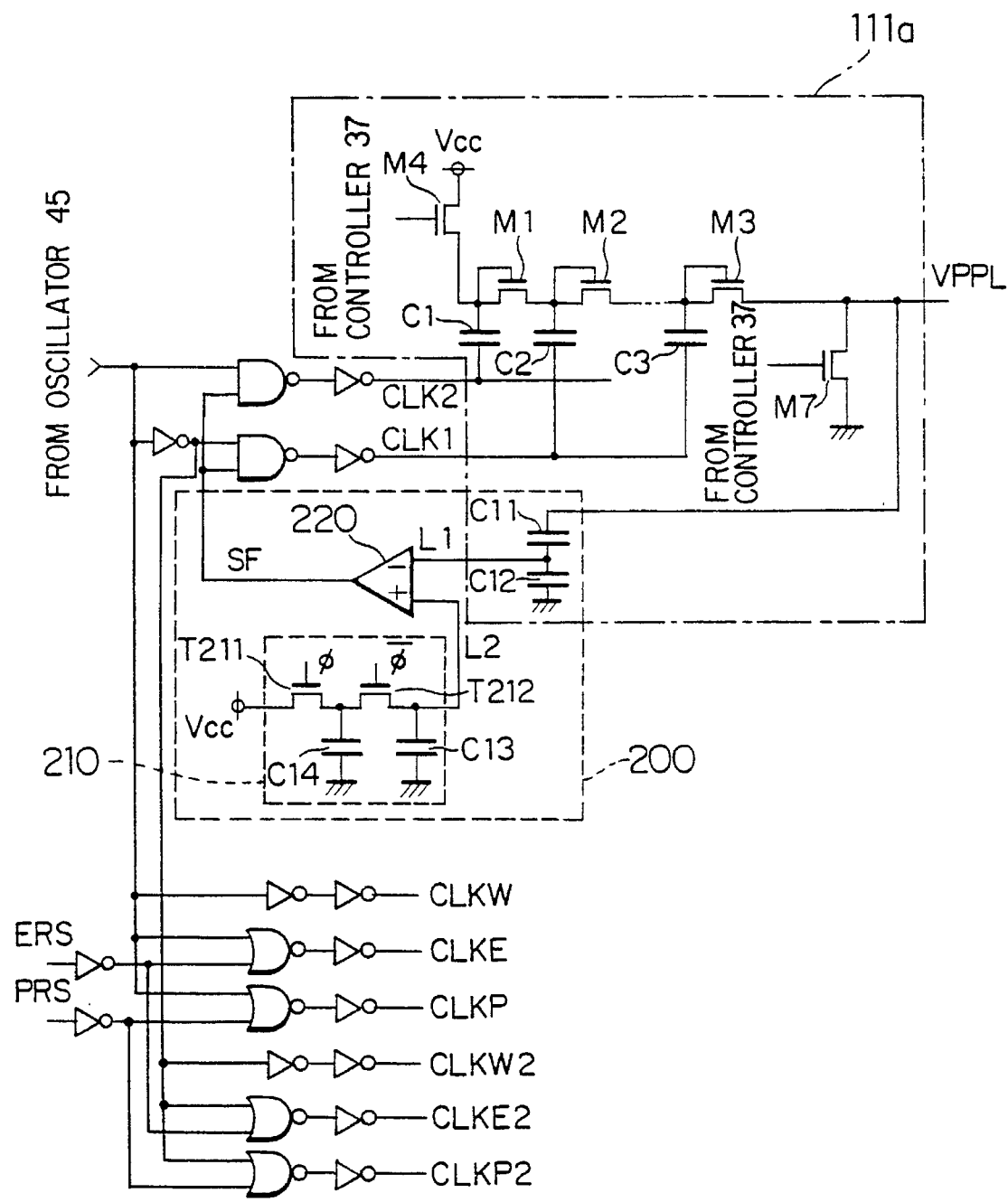
FIG. 2 is a circuit diagram illustrating the configuration of a Vpp generator in a semiconductor integrated circuit according to the present invention.
Figure 8:
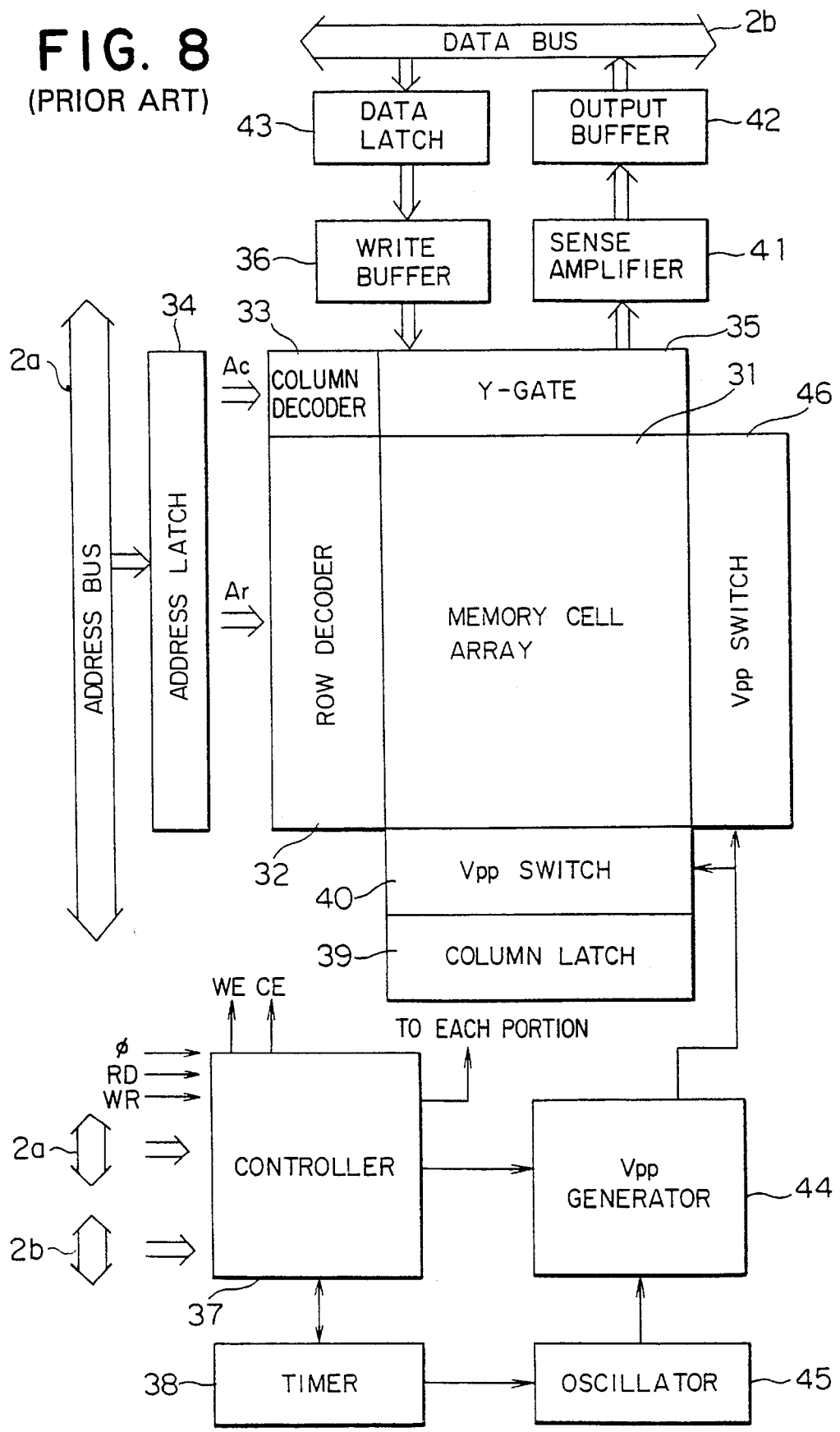
FIG. 8 is a block diagram illustrating a general configuration of the EEPROM of FIG. 7.
Figure 9A:
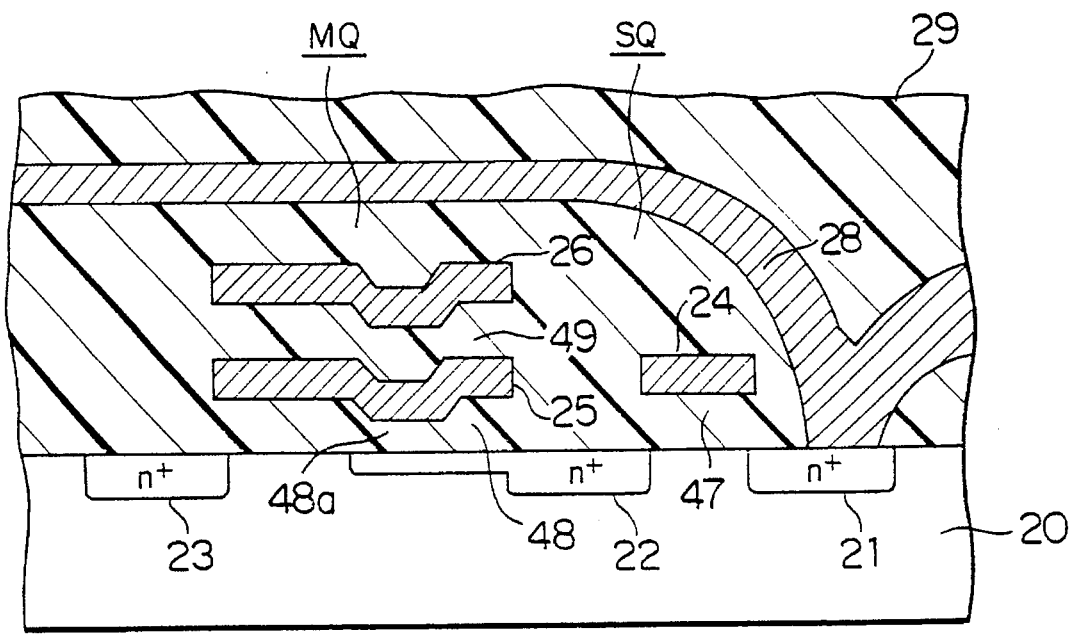
FIG. 9A is a cross-sectional view of one memory cell of a memory cell array of the EEPROM of FIG. 8.
Figure 9B:
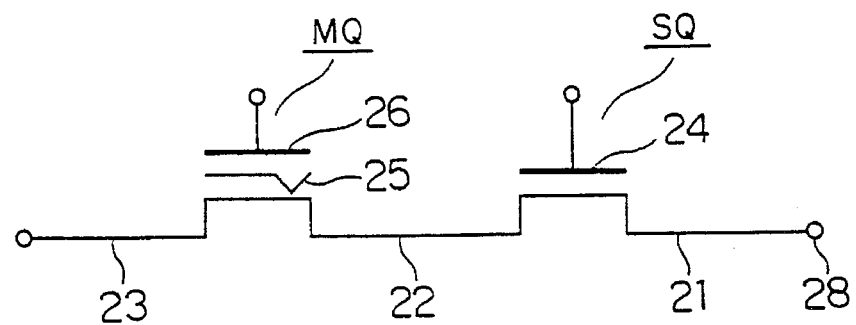
FIG. 9B is a circuit diagram illustrating an equivalent circuit of the memory cell of FIG. 9A.

FIG. 2 illustrates the circuit configuration of the Vpp generator (high voltage generator) 44 for use in the semiconductor integrated circuit according to the present invention (refer to FIG. 8). The Vpp generator 44 differs from the conventional one shown in FIG. 12 in that there are provided additional portions for generating clock signals CLKW2, CLKE2, CLKP2 each having a phase opposite to the phase of respective clock signal CLKW, CLKE, CLKP.

The EEPROM memory cell array includes memory cells MC1, MC2, MC3, and MC4 shown in FIG. 1. The high voltage generation means includes the portion shown in FIG. 2. The means for selectively supplying a high voltage includes the Vpp switches 400a–400d, 460e, and 460f shown in FIG. 1. The control means includes the EEPROM control systems 104 and 105 including portions except for the EEPROM memory cell array and except for the high voltage supplying means of FIG. 1.

The operation of the Vpp switch, which is one features of the present invention, will be described below taking the Vpp switch 400c of FIG. 1 as an example. In the Vpp switch 400c, when the column latch 39a has an H level, and the bit signal transfer control signal BTTR is at an H level, the bit line BL1 rises. In this state, if the clock signal CLKP is at an L level, the transistor M50 turns on. As a result, the capacitor C40 is charged by the high voltage Vpp until the transistor M50 turns off. Then, the clock signal CLKP rises, and the opposite-phase clock signal CLKP2 falls down, whereby the charges stored in the capacitor C40 are transferred to the capacitor C50 via the transistor M60 until the transistor M60 turns off. When the clock signal CLKP2 then rises, the charges stored in the capacitor C50 flow out into the bit line BL1 via the transistor M70 until the transistor M70 turns off. As a result of this, the potential of the gate of the transistor M50 connected to the bit line BL1 rises, whereby the capacitor C40 is further charged by the high voltage Vpp until the transistor M50 turns off.

In the above operation, the clock signals CLKP and CLKP2 having an amplitude equal to Vcc raise the voltage via the capacitors C40 and C50, and voltage loss occurs due to the threshold voltages Vth of the transistors M50, M60, and M70. From the above rough estimation, it can be seen that the high voltage Vpp can appear at the output of the Vpp switch when 2Vcc >3 Vth. Compared to the conventional Vpp switch which can transmit a high voltage when Vcc >2Vth, the Vpp switch of the present invention can transmit a high voltage with lower power supply voltage. This means that the Vpp switch of the present invention can operate with a lower power supply voltage Vcc.

EMBODIMENT 2

Figure 3:
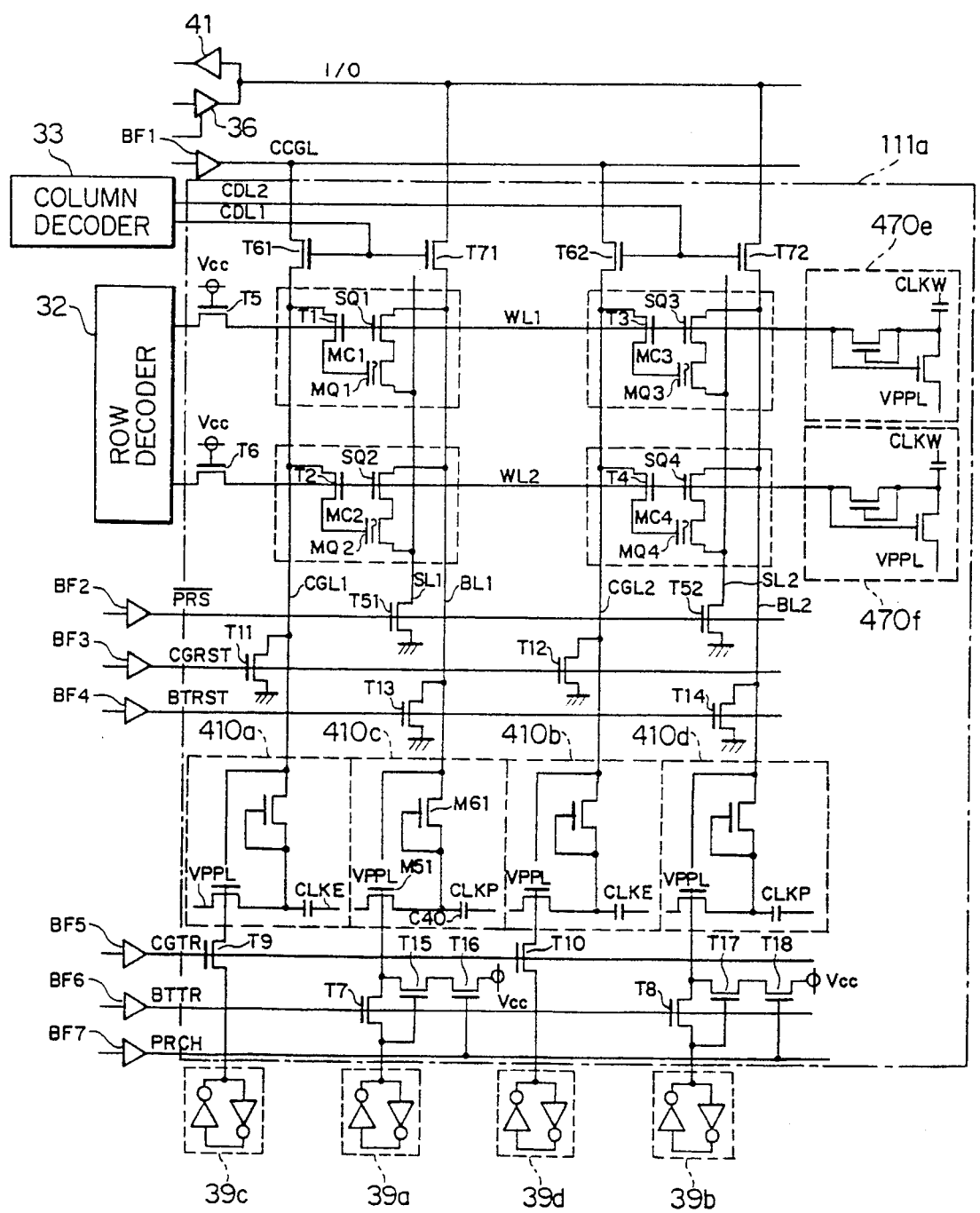
FIG. 3 is a circuit diagram illustrating the configuration of a peripheral portion of an EEPROM memory cell array in a semiconductor integrated circuit according to a second embodiment of the present invention.

FIG. 3 is a circuit diagram illustrating a circuit configuration of a peripheral portion of an EEPROM memory cell array in a semiconductor integrated circuit according to the second aspect of the present invention. In this embodiment, the threshold voltage Vth of the selection transistor of each Vpp switch is set to a value different from that of the charge pump transistor, wherein the threshold voltage Vth of the charge pump transistor is set to a value lower than the threshold voltage Vth of the selection transistor, so that enhanced charge pump performance may be achieved. In FIG. 3, the Vpp switches according to the present embodiment are denoted by reference numerals 410a–410d, 470e, and 470f. The other portions are basically the same as those according to the conventional technique. Since the Vpp switches 410a–410d, 470e, and 470f have the same configuration, only the Vpp switch 410c will be described below.

There is provided a selection transistor responsible for the selection in the operation of selectively supplying a high voltage to a memory cell. There are also provided a charge pump transistor M61 and a capacitor C40, which form a charge pump. The transistor M61 is diode-connected, and its source is connected to the bit line BL1. The threshold voltage Vth of the selection transistor M51 is set to such a value that the selection transistor M51 may completely turn off when the bit line BL1 is at an L level. The threshold voltage Vth of the charge pump transistor M61 is set to a low value so that the capability of transferring the high voltage Vpp to the bit line BL1 may be enhanced.

If the threshold voltage Vth of the selection transistor M51 is set to Vth1, and that of the charge pump transistor M61 is set to Vth2, then it is possible to transfer the high voltage Vpp when Vcc >Vth1 +Vth2. From the above, it can be seen that if the threshold voltage Vth2 of the charge pump transistor M61 is set to a sufficiently low value, then it is possible to operate with a lower power supply voltage Vcc.

EMBODIMENT 3

Figure 4:
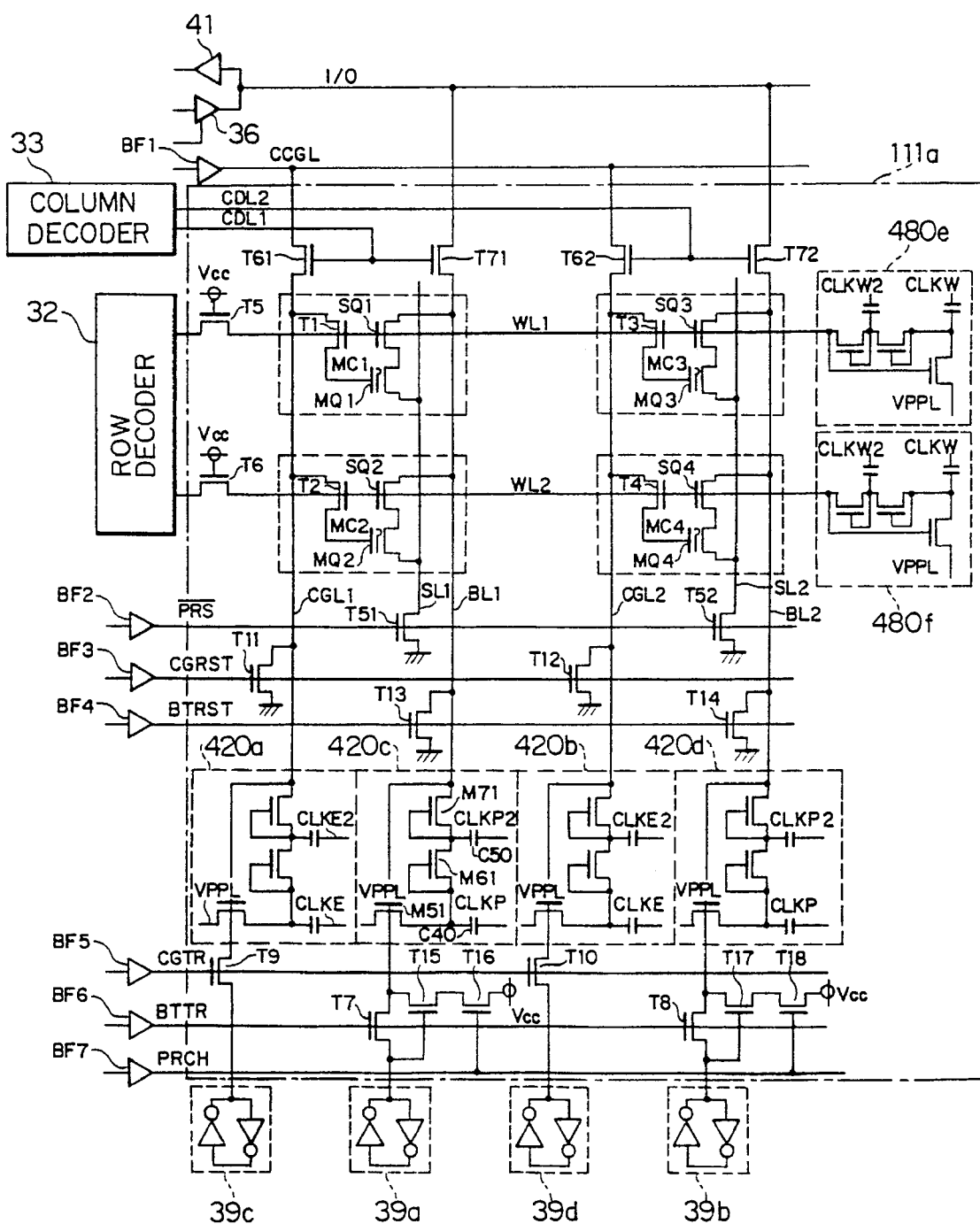
FIG. 4 is a circuit diagram illustrating the configuration of a peripheral portion of an EEPROM memory cell array in a semiconductor integrated circuit according to a third embodiment of the present invention.

FIG. 4 is a circuit diagram illustrating a circuit configuration of a peripheral portion of an EEPROM memory cell array in a semiconductor integrated circuit according to the third aspect of the present invention. In a Vpp switch of the present embodiment, there is provided a charge pump comprising a plurality of stages (two stages, for example), and, furthermore, the threshold voltage Vth of the selection transistor is set to a value different from that of the charge pump transistor, wherein the threshold voltage Vth of the charge pump transistor is set to a value lower than the threshold voltage Vth of the selection transistor, so that further enhanced charge pump performance may be achieved. In FIG. 4, the Vpp switches according to the present embodiment are denoted by reference numerals 420a–420d, 480e, and 480f. The other portions are basically the same as those according to the conventional technique. Since the Vpp switches 420a–420d, 480e, and 480f have the same configuration, only the Vpp switch 420c will be described below.

In this embodiment, transistors M61, M71, and capacitors C40, C50 form a multi-stage (two stage, for example) charge pump, and, furthermore, the threshold voltage of the selection transistor M51 is set to a value different from those the charge pump transistors M61, M71. Ii the threshold voltage Vth of the selection transistor M51 is set to Vth1, and those of the charge pump transistors M61 and M71 are set to Vth2, then it is possible to transfer the high voltage Vpp when 2Vcc >Vth1+2Vth2. This means that if the threshold voltages Vth2 of the charge pump transistors M61 and M71 are low enough, then it is possible to operate with a lower power supply voltage Vcc.

In embodiments 1 and 3, the charge pump comprises two stages. However, the present invention is not so limited. The charge pump may comprise an arbitrary number of stages.

EMBODIMENT 4

Figure 5:
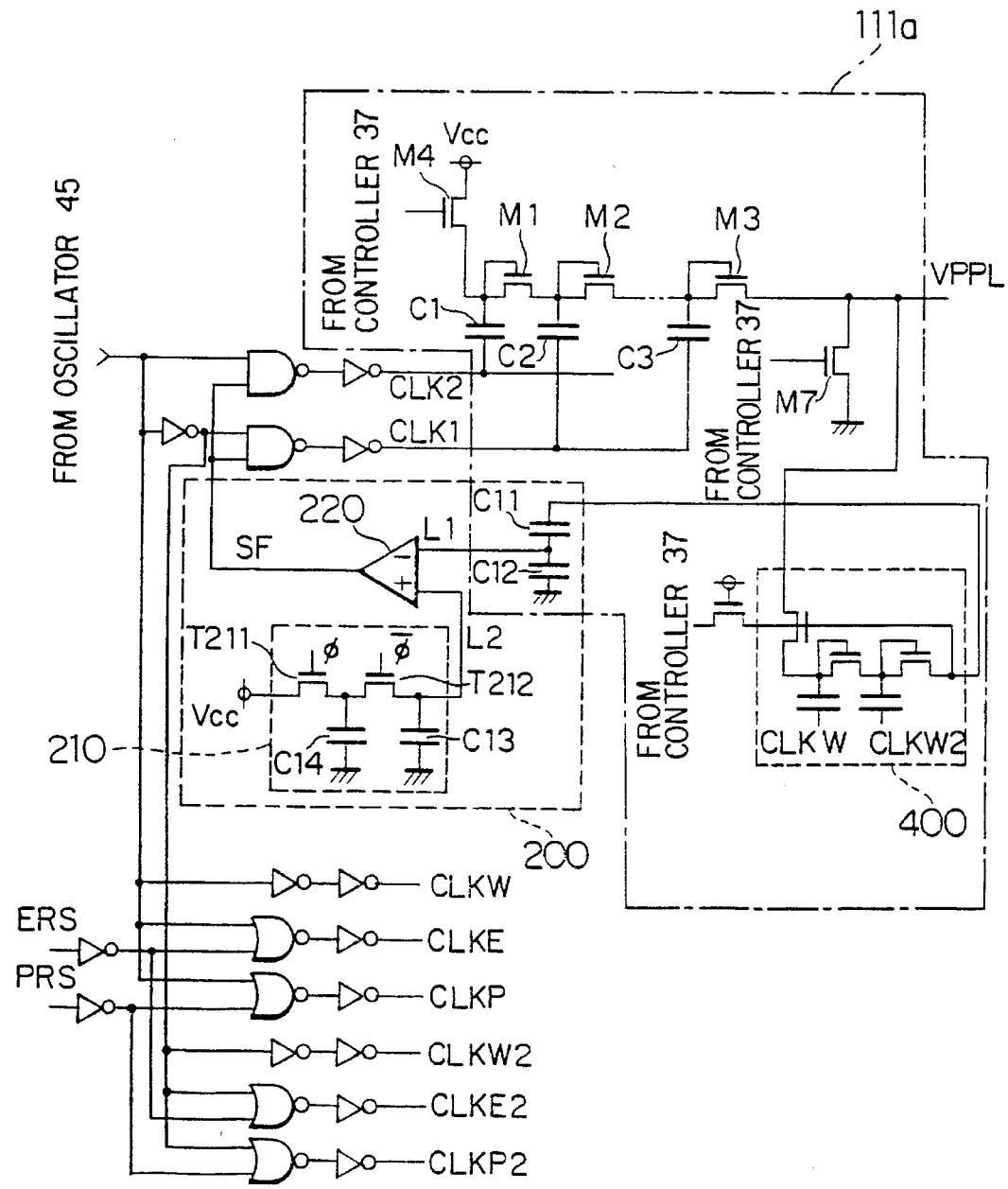
FIG. 5 is a circuit diagram illustrating the configuration of a Vpp generator in a semiconductor integrated circuit according to a fourth embodiment of the present invention.
Figure 12:
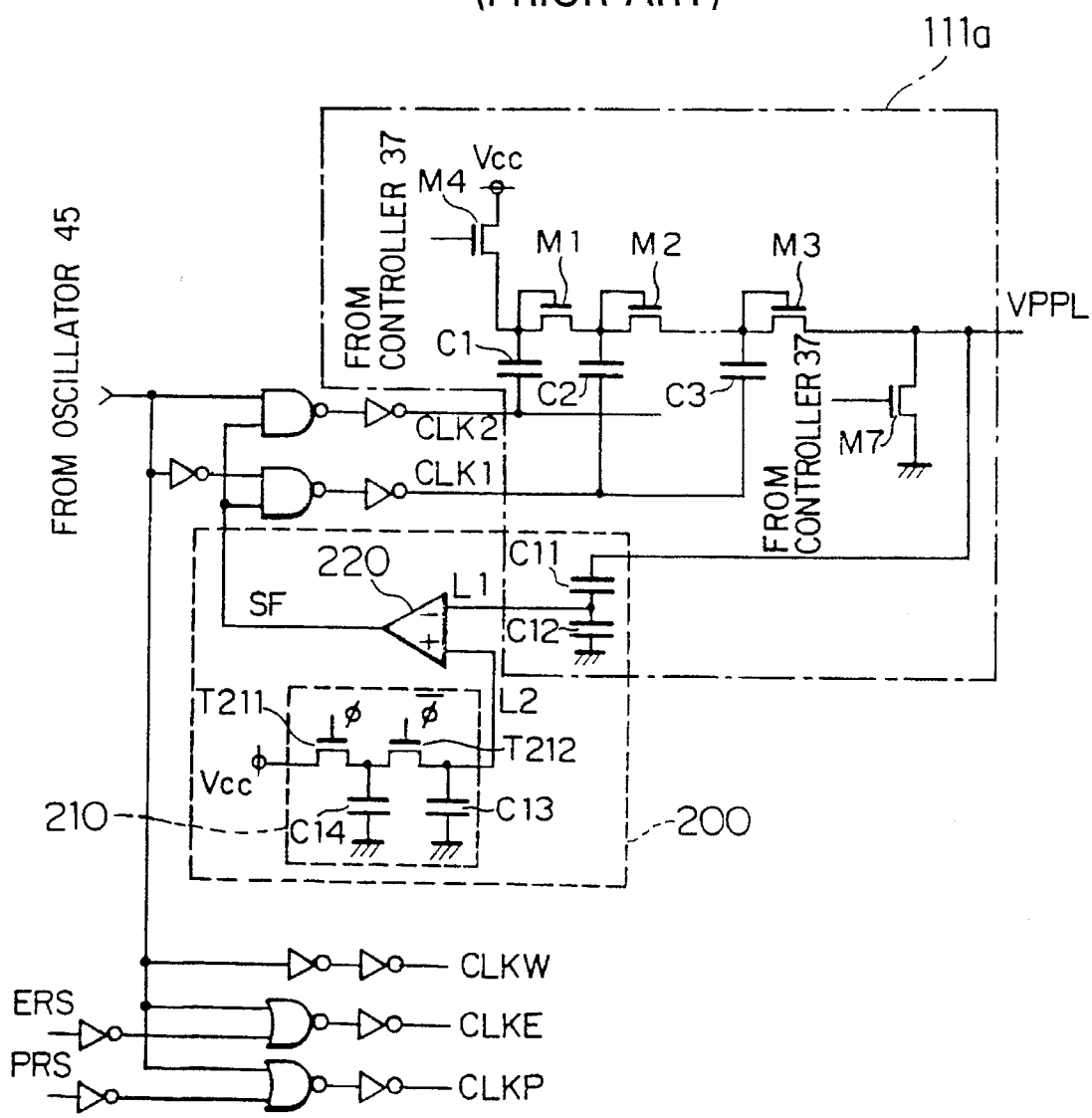
FIG. 12 is a circuit diagram illustrating the configuration of a Vpp generator of FIG. 7.

FIG. 5 illustrates the circuit configuration of a Vpp generator (refer to FIG. 8) in a semiconductor integrated circuit according to the fourth and fifth aspects of the present invention. A waveform shaping circuit 200 acting as waveform shaping means is a circuit which performs waveform shaping of a high voltage waveform so as to prevent the output of the Vpp switch from rising too quickly. In the conventional Vpp generator, as shown in FIG. 12, the waveform shaping is performed based on the feedback signal from the output of the charge pump comprising the transistors M1–M4, M7, and the capacitors C1–C3. However, there is a slight difference in voltage waveform between the charge pump output and the actual output of the Vpp switch. As described above, especially when the charge pump capability of the Vpp switch is enhanced, the difference in voltage between the charge pump output and the actual output of the Vpp switch becomes large. If the output of the Vpp switch is monitored and applied to the input (the capacitor C11) of the waveform shaping circuit 200, then more accurate waveform shaping can be achieved. In view of the above, in the Vpp generator of this embodiment, there is provided a dummy Vpp switch 400 which is a dummy circuit used only for providing an input signal to the waveform shaping circuit 200, thereby achieving more accurate waveform shaping.

EMBODIMENT 5

Figure 6:
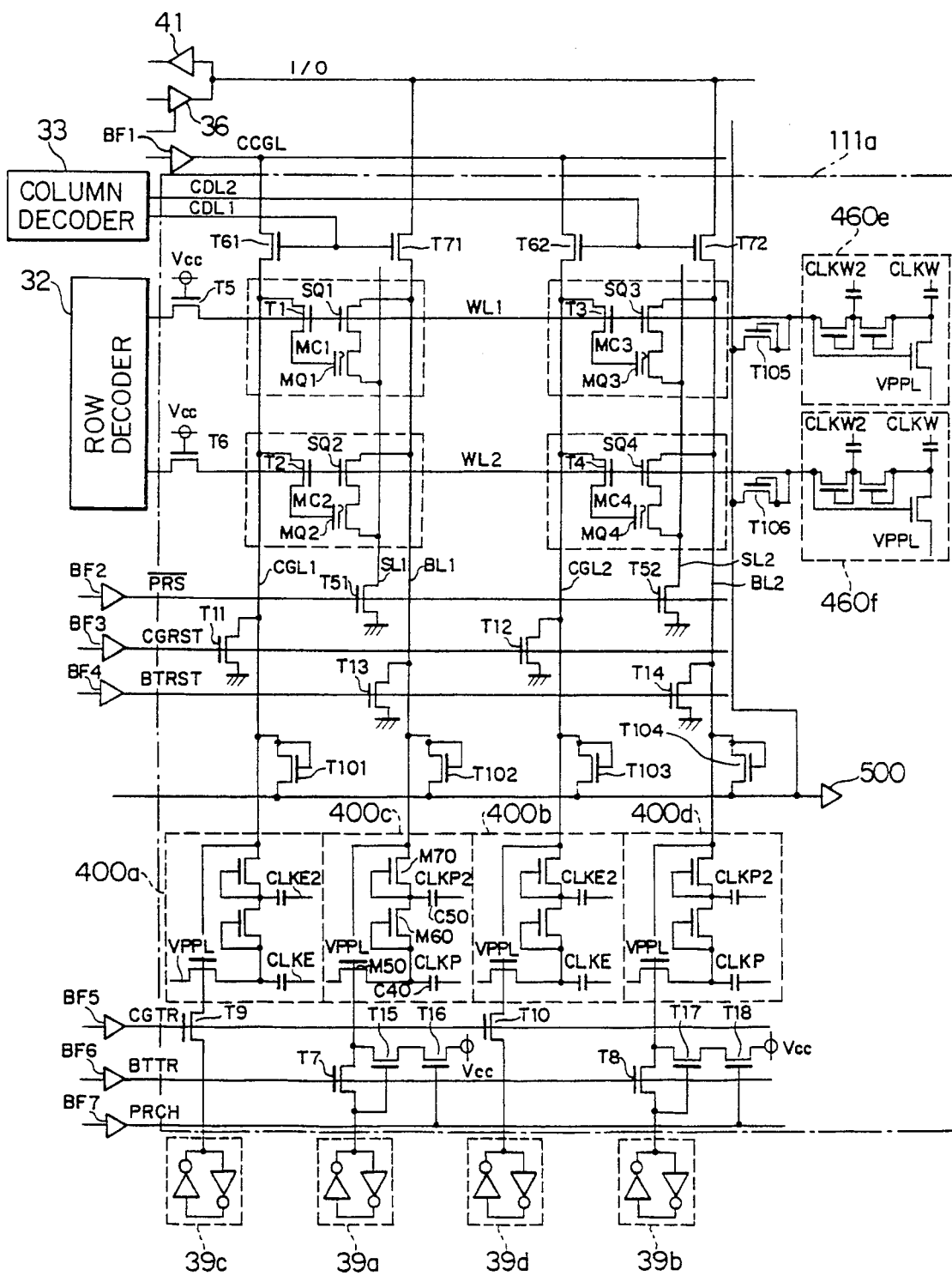
FIG. 6 is a circuit diagram illustrating the configuration of a peripheral portion of an EEPROM memory cell array in a semiconductor integrated circuit according to a fifth embodiment of the present invention.

FIG. 6 is a circuit diagram illustrating a circuit configuration of a peripheral portion of an EEPROM memory cell array in a semiconductor integrated circuit according to the sixth aspect of the present invention. As the fourth embodiment, this embodiment can also provide more accurate waveform shaping. In this embodiment, instead of a dummy Vpp switch, there are provided output detection transistors T1O1–T106 (high voltage detection means) as shown in FIG. 6, wherein all bit lines BL1, BL2 extending in the memory cell array in the vertical direction, all control gate lines CGL1, CGL2 (four lines in the case of FIG. 6), and all word lines WL1, WL2 (six lines in the case of FIG. 6) have their own detection transistor for detecting the output of a Vpp switch connected to the respective lines. These output detection transistors T101–T106 are connected in parallel so that the highest output of the detected outputs may be employed as a detection output 500 which is supplied to the input of the waveform shaping circuit 200 (via the capacitor C11) instead of the output of the dummy Vpp switch. With this arrangement, the output of a Vpp switch which generates the highest output is fed back. Waveform shaping is performed based on this fed-back signal, thereby ensuring that quick rising of the high voltage may be suppressed.

As described above, in the Vpp switch acting as means for selectively supplying a high voltage to a memory cell according to the first aspect of the present invention, there is provided a multi-stage charge pump wherein each stage comprises a capacitor and a transistor whose drain and gate are connected so that the charging capability is enhanced, whereby the high voltage Vpp may be transferred with a lower power supply voltage Vcc. Thus, the first aspect of the present invention provides a semiconductor integrated circuit which can operate with a lower power supply voltage Vcc.

In the Vpp switch acting as means for selectively supplying a high voltage to a memory cell, according to the second aspect of the present invention, the threshold voltage Vth of a diode-connected charge pump transistor is set to a value lower than the threshold voltage Vth of an on/off selection transistor, such that the threshold voltage of the diode-connected transistor is set to a low value while maintaining the operation capability of the selection transistor, thereby increasing the charging capability. As a result, the high voltage Vpp can be transferred with a lower power supply voltage Vcc. Thus, the second aspect of the present invention provides a semiconductor integrated circuit which can operate with a lower power supply voltage Vcc.

In the third aspect of the present invention, the first and second aspects of the present invention are combined such that a Vpp switch, acting as means for selectively supplying a high voltage to a memory cell, comprises a multi-stage charge pump, and furthermore the threshold voltage Vth of a diode-connected charge pump transistor is set to a value lower than the threshold voltage Vth of an on/off selection than the threshold voltage Vth of an transistor, thereby further enhancing the charging capability. Thus, the third aspect of the present invention provides a semiconductor integrated circuit which can operate with a lower power supply voltage Vcc.

In the fourth through sixth aspects of the present invention, a slight difference between the voltage generated by a charge pump of high voltage generation means and the output voltage of a vpp switch, especially a rather large difference occurring when the charging capability of the Vpp switch is enhanced, is suppressed by employing the output of the Vpp switch as a monitoring point of waveform shaping means for preventing the high voltage from rising too quickly, whereby more accurate waveform shaping can be achieved. Thus, these aspects of the present invention provide a semiconductor integrated circuit having higher reliability.

Especially in the fifth aspect of the present invention, the above purposes may be readily achieved simply by adding a dummy Vpp switch to high voltage generation means, wherein the dummy Vpp switch is used only to provide feedback of the high voltage.

In the sixth aspect of the present invention, there is provided high voltage detection means for detecting the highest voltage of all lines having a Vpp switch in a memory cell array, wherein the detected voltage is fed back to the input of waveform shaping. means so that waveform shaping may be done based on the fed-back signal, thereby ensuring that the high voltage is prevented from rising too quickly. Thus, the sixth aspect of the present invention provides a semiconductor integrated circuit having higher reliability.

What is claimed is:

1. A semiconductor integrated circuit comprising:

an EEPROM memory cell array comprising a plurality of memory cells disposed in a matrix, each memory cell including a non-volatile memory transistor for electrically writing and erasing data;

means for generating a high voltage required to write data into and erase data from said memory cell array;

means for selectively supplying the high voltage to a memory cell;

means for shaping a waveform of the high voltage so that the high voltage does not rise too quickly, said means for shaping a waveform including a dummy circuit for supplying the high voltage to said means for shaping a waveform; and means for controlling said means for generating and said means for selectively supplying to control writing data into, reading data from, and erasing data from the memory cell array; said means for shaping the waveform receiving a high voltage which has passed through said means for selectively supplying the high voltage, said means for shaping the waveform performing waveform-shaping in response to the received high voltage.

2. A semiconductor integrated circuit comprising:

an EPROM memory cell array including a plurality of memory cells disposed in a matrix each memory cell including a non-volatile memory transistor for electrically writing and erasing data;

means for generating a high voltage required to writing data into and erase data from said memory cell array;

means for selectively supplying the high voltage to a memory cell;

means for shaping a waveform of the high voltage so that the high voltage does not rise too quickly;

means for controlling said means for generating and said means for selectively supplying to control writing data into, reading data from, and erasing data from the memory cell array, said means for shaping the waveform receiving a high voltage which has passed through said means for selectively supplying the high voltage, said means for shaping the waveform performing waveform-shaping in response to the received high voltage; and high voltage detection means for detecting a largest of the high voltages which have been passed through said means for selectively supplying a high voltage, said high voltage detection means supplying the largest voltage to said means for shaping a waveform.

* * * * *

UNITED STATES PATENT AND TRADEMARK OFFICE
CERTIFICATE OF CORRECTION

PATENT NO. : 5,594,692
DATED : January 14, 1997
INVENTOR(S) : Yamaguchi

It is certified that error appears in the above-indentified patent and that said Letters Patent is hereby corrected as shown below:

Column 17, Line 32, change ";" to --,--;

Column 18, Line 6, change "EPROM" to --EEPROM--;

Line 7, after "matrix" insert --,--.

Signed and Sealed this

Sixth Day of May, 1997

Attest:

BRUCE LEHMAN

Attesting Officer        Commissioner of Patents and Trademarks